United States Patent [19]

Siuta

[11] Patent Number: 4,687,597

[45] Date of Patent: Aug. 18, 1987

[54] COPPER CONDUCTOR COMPOSITIONS

[75] Inventor: Vincent P. Siuta, Cherry Hill, N.J.

[73] Assignee: E. I. Du Pont de Nemours and Company, Wilmington, Del.

[21] Appl. No.: 823,657

[22] Filed: Jan. 29, 1986

[51] Int. Cl.$^4$ ............................................. H01B 1/02
[52] U.S. Cl. ....................................... 252/512; 75/252; 75/255; 106/1.13; 106/1.15; 252/514; 252/515; 252/518; 252/519
[58] Field of Search ................ 75/252, 255; 106/1.13, 106/1.15, 1.18, 1.21; 252/512, 514, 515, 518, 519; 427/125, 126.1, 126.2, 126.6

[56] References Cited

U.S. PATENT DOCUMENTS

| | | | |
|---|---|---|---|
| 3,794,518 | 2/1974 | Howell | 252/512 |
| 3,957,453 | 5/1976 | Hässler et al. | 252/512 |
| 4,323,483 | 4/1982 | Rellick | 252/512 |
| 4,514,321 | 4/1985 | Siuta | 106/1.13 |
| 4,521,329 | 6/1985 | Siuta et al. | 106/1.13 |

FOREIGN PATENT DOCUMENTS 61411  5/1976  Japan ................................ 75/252

Primary Examiner—L. Dewayne Rutledge
Assistant Examiner—Robert L. McDowell

[57] ABSTRACT

A fritless copper conductor composition suitable for overprinting on copper consisting essentially of (a) 10–50% wt. finely divided copper particles, (b) 90–50% wt. coarse copper particles, (c) 0.2–2% wt. reducible heavy metal oxide, (d) 0–1.0% refractory metal and (e) 0–5.0% of a high surface area noble metal, all the particles being dispersed in an organic medium.

8 Claims, No Drawings ively. The conductor layer is fired in nitrogen at 900° C. Then a pattern of resistor material is printed in
COPPER CONDUCTOR COMPOSITIONS

FIELD OF THE INVENTION

The invention relates to copper conductor compositions and particularly to such compositions for overprint applications.

BACKGROUND OF THE INVENTION

Thick film conductors are widely used as a means of interconnecting various passive and active devices for hybrid microcircuits and resistor networks. Utility as a general purpose conductor requires certain performance attributes such as conductivity, solderability, solder leach resistance, compatibility with other circuit components and ability to be processed under a wide range of conditions. Inherent in the usefulness of thick film conductors is the cost of materials in the composition. It is extremely advantageous to reduce the cost without significantly changing the performance characteristics.

Thick film conductors are comprised of conductive metal and inorganic binder, both of which are in finely divided form and are dispersed in an organic medium. The conductive metal is ordinarily gold, palladium, silver, platinum or mixtures and alloys thereof, the choice of which depends upon the particular combination of performance characteristics which are sought, e.g., resistivity, solderability, solder leach resistance, migration resistance, adhesion and the like.

In the current economic climate in which noble metals have experienced substantial fluctuations in price, it is especially attractive from a business viewpoint to substitute less expensive base metals as the conductive metal in thick film conductor compositions. Several base metals have been proposed and used with mixed success as the conductive phase for thick film conductors. Among these the most important is copper.

When copper conductors are used in microcircuits, they are frequently subjected to quite rigorous conditions during fabrication. For example, in a typical application, the copper-containing composition is printed on a substrate, dried and fired in a nitrogen atmosphere at 900° C. Then a pattern of resistor material is printed in proper registry atop the conductor layer and the copper-containing composition and overlying layer of resistor material are fired at about the same temperature in nitrogen to effect sintering of the resistor material. Following this, an overglaze may be applied and the entire assemblage is fired in nitrogen once again to sinter the overglaze material. When this is completed, leads are soldered onto the conductive layer. Thus, in this typical situation, the copper is subjected to as many as three high temperature firings and, in some fabrication, the copper-containing layer may be subjected to as many as ten such firings.

During such refirings the copper conductor loses solderability and bondability because of copper oxidation and migration of glass binder to the surface of the copper containing layer. Whenever the problem of bondability has risen with respect to noble metal conductors which are fired in air rather than nitrogen, one successful solution to the problem has been to overprint and fire a patterned thin layer of fritless gold onto the problem substrate in the area where the bonding is to take place. Thus, when components are attached to the conductor, they are bonded in the gold-overprinted areas. However, it has been shown not to be feasible to use gold as an overprint for copper because the metals form an undersirable alloy during firing. Furthermore, when fritless copper overprinting has been attempted in nitrogen-fired copper conductor systems, the overprinted copper layer rapidly becomes oxidized on firing and thus is rendered less solderable and bondable than the underlying layer.

Thus there remains a substantial need for an effective overprint composition which can be used in nitrogen fired copper conductor systems.

BRIEF DESCRIPTION OF THE INVENTION

The invention is therefore directed in its primary aspect to a fritless composition suitable for use in overprinting copper conductors which is an admixture of finely divided particles consisting essentially of (a) 10–50% wt. copper metal, the particles of which are all less than 2 μm in largest dimension, less than 10% wt. of which are less than 0.5 μm in largest dimension and which have an average particle size of 0.7–1.2 μm and an average surface area of less than 2 m$^2$/g;

(b) 90–50% wt. copper metal, the particles of which are 1–10 μm in largest dimension and have an average particle size of at least 1.5μm;

(c) 0.2–2% wt. reducible heavy metal oxide selected from oxides of Pb, Bi, Cd, Co, Ni and mixtures and precursors thereof;

(d) 0–1.0% wt. of a refractory metal selected from tungsten, molybdenum, rhenium and mixtures thereof; and (e) 0–5.0% wt. of a noble metal selected from palladium, platinum, ruthenium, irridium, rhodium and mixtures and alloys thereof having a surface area of 2–10 m$^2$/g.

In a secondary aspect, the invention is directed to screen-printable thick film compositions comprising the above-described particulate composition dispersed in organic medium.

In a still further aspect, the invention is directed to a method of making a conductive surface having good bondability and solderability comprising the sequential steps of:

(1) applying a patterned layer of the above-described thick film conductor composition to a substrate; and (2) firing the patterned conductive layer in a nonoxidizing atmosphere to effect volatilization of the organic medium and sintering of the copper.

PRIOR ART

Pribot et al., in French Patent Application No. 82 06600, disclose the overprinting of a conductive metal onto a metal and glass-containing substrate with a fritless layer consisting only of pure metal and organic medium.

In U.S. Pat. No. 4,514,321, Siuta discloses a thick film conductor composition comprising 2–4 μm average particle size copper, frit and refractory metal (W. Mo. or Re) dispersed in organic medium.

DETAILED DESCRIPTION OF THE INVENTION

A. Copper

Because the presence of certain impurities in the copper decreases electrical conductivity and interferes with sintering of the copper and solderability of the copper film, it is essential as a practical matter that the copper, exclusive of any oxide layer thereon, be at least about 99.8% pure on a weight basis and preferably even higher. This is especially important because with the composition of the invention, in addition to excellent solderability, it is necessary to obtain maximum electrical conductivity and sintering of the copper particles at a relatively low firing temperature range (750°–950° C.), which is significantly below the melting point of the copper (1083° C.).

The average composition of the copper particles used in the invention should contain no more than about 0.5% wt. oxygen (O) as surface oxide, which is equivalent to no more than about 5.0% $Cu_2O$. While the average particle size (50% point on the Sedigraph(R) particle size analyzer)(1) of the fine copper particles can range from 0.7 to 1.2 μm, it is preferred that it be about 1 μm. In general, it is preferred that neither the fine nor coarse particles have high surface areas since burnout of the organic medium is adversely affected thereby. Though fine particle surface areas as high as 2 m²/g are satisfactory, it is nevertheless preferred that the copper particles have a surface are of less than 1 m²/g.

(1) Sedigraph ® is a trademark of the Micromeritics Instrument Corp., Norcross, CA for particle size analysis devices.

The amount of fine copper powder (component (a)) must be at least 10% wt. and preferably, 15% wt. In order to get good fired film density, surface bondability and solderability. With higher amounts of the fine copper particles. surface properties of the sintered copper continue to improve, but with the inclusion of the heavy metal oxide sintering promoters there is no substantial additional benefit realized beyond about 50% wt.

With respect to the coarse copper metal particles, it is preferred that substantially all have a particle size no more than 10 μm for the reason that particles larger than 10 μm tend not to print well because of screen clogging. Nevertheless, on the order of 5% wt. of such larger particles can be tolerated in most instances. Thus, as used in this context, the term "substantially all" means at least about 95% wt.

B. Heavy Metal Oxide

The purposes of the heavy metal oxide component are to promote sintering of the copper and adhesion to the underlying substrate. Suitable metal oxides are those which are easily reducible and, in particular, which have a standard free energy of formation ($\Delta G°$) greater than $-100$ Kcal/g-atom oxygen at the firing conditions. These include PbO, $PbO_2$, $Bi_2O_3$, CdO, CoO, NiO and mixtures and precursors thereof. All these materials are considered to be glass modifiers, but they do not themselves form glasses. At least 0.2% wt. reducible oxide is required to be effective, but if more than 2.0% is used, the sintered copper surface tends to have reduced solderability. For this reason 0.5–1.0% wt. reducible oxide is preferred.

C. Refractory Metal

Even though it is not essential that the refractory metal be used in the composition of the invention, it is nevertheless preferred. The purpose of the refractory metal component of the composition is to increase the ability of the composition to withstand multiple refirings while retaining good solderability and bondability. It is believed that these metals function by combining with migratory components from the underlying glasses, thus forming high softening point glasses and compounds which are less capable of further migration during the rigors of multiple firing. Thus, the refractory materials slow down the migration of underlying glass materials, which would otherwise reduce solderability and bondability of the exposed sintered copper surface.

The use of at least 0.2% wt. refractory metal is needed to be effective in this function. At least 0.3% is preferred, while 0.5% wt. has been found to be optimum in the systems studied. Above 1.0% wt., the refractory metal tends to interfere with copper sintering and thus may reduce adhesion to the copper surface. Therefore, no more than 0.7% wt. refractory metal is preferred.

In the case of tungsten, the refractory metal also appears to act as a reducing agent for any $Cu_xO$ which may be on the surface of the copper in the composition, thus serving as an oxygen scavenger and cleanser for the exposed surface of the copper. Both mixtures and alloys of the refractory metals can be used in the composition.

D. Noble Metal

An important and therefore preferred constituent of the composition of the invention is the small content of noble metal which has been found to promote both higher density of the copper film as well as a brighter, smoother, cleaner and therefore more useful surface. In view of the fact that the noble metal is likely acting as a catalyst during the burnout of organic medium, it is preferred that the noble metal powder have a surface area of at least 2 m²/g and preferably at least 3 m²/g. However, if the surface area of the noble metal is too high, i.e., above 15 m²/g, the surface characteristics of the fired copper surface are deteriorated due to poor paste rheology. For this reason, a surface area of no more than 10 m²/g is preferred. A noble metal particle surface area of 4–6 m²/g has been found to be optimum in the system study.

Suitable noble metals are palladium, platinum, ruthenium, irridium, rhodium and alloys and mixtures thereof. At least 0.2% wt. of the noble metal is needed for it to be effective in its catalytic function and 0.5% wt. is preferred. Beyond 5.0% wt., the catalytic effectiveness of the noble metal is not appreciably greater.

E. Organic Medium

The inorganic particles are mixed with an organic liquid medium (vehicle) by mechanical mixing to form a pastelike composition having suitable consistency and reheology for screen printing. The paste is then printed as a "thick film" on dielectric or other substrates in the conventional manner.

Any inert liquid may be used in the vehicle so long as it volatilizes out cleanly upon drying and firing. Various organic liquids, with or without thickening and/or stabilizing agents and/or other additives, may be used as the vehicle. Exemplary of organic liquids which can be used are the aliphatic alcohols, esters of such alcohols, for example, acetates and propionates, terpenes such as terpineol and the like, solutions of resins such as the polymethacrylates of lower alcohols, and solutions of ethyl cellulose in solvents such as Texanol, and the monobutyl ether of ethylene gylcol monoacetate. The vehicle may also contain volatile liquids to promote fast drying after application to the substrate.

Even though a wide variety of inert liquids can be used in the organic medium, it has nevertheless been found that, unlike conventional thick film compositions, it is better if the organic polymer content of the organic medium used in the invention is kept to a minimum for the particular polymer system empolyed. For example, it is preferred that ethyl cellulose resin be maintained at a level no higher than 1.0% by weight of the solids content of the dispersion. A polymer level no higher than 0.7% by weight is preferred. However, much higher polymer levels of 10–20% by weight must be used with acrylic resins in order to achieve a satisfactory printing viscosity. Fortunately these higher polymer levels can be tolerated because acrylics exhibit superior burnout characteristics. Somewhat higher polymer levels in the organic medium can be tolerated if the nitrogen firing atmosphere contains several ppm oxygen in the burnout zone of the furnace.

In theory, it would be desirable to have no resin at all in the organic medium. However, as a practical matter, the organic medium must contain at least about 0.5 to 3% by weight resin in order to obtain suitable rheological properties in the dispersion and adequate green strength in the applied copper film when it is applied by screen printing.

The ratio of organic medium to solids in the dispersion can vary considerably and depends upon the manner in which the dispersion is to be applied and the kind of vehicle used. Normally, to achieve good coverage, the dispersions will contain complementally 70–90% solids and 30–10% vehicle.

In formulating the compositions of the invention, it is preferred to minimize the amount of organic medium and also, as indicated above, to minimize the amount of high molecular weight materials in the organic medium. The reason for this in both instances is to provide for complete burnout of the organic medium. The amount of oxygen available for volatilization of the organic medium by oxidation is, of course, quite limited because of the necessity of firing the copper in a nonoxidizing atmosphere. Therefore, in the formulation of the composition, the rheology is adjusted to obtain the desired printing viscosity with the least possible amount of organic medium. Thus, both to decrease the viscosity as well as to enhance volatilization of the organic medium, it is also preferred to limit the amount of resin in the organic medium to a level of 10% by weight or below, which corresponds to less than 1.0% by weight of the total formulation. The compositions of the present invention may, of course, be modified by the addition of other materials which do not adversely affect its beneficial characteristics. Such formulation is well within the skill of the art.

The viscosity of the pastes for screen printing is typically within the following ranges when measured on a Brookfield HBT Viscometer at low, moderate and high shear rates:

| Shear Rate (Sec$^{-1}$) | Viscosity (Pa.S) | |
| --- | --- | --- |
| 0.2 | 100–5000 | — |
| | 300–2000 | Preferred |
| | 600–1500 | Most preferred |
| 4 | 40–400 | — |
| | 100–250 | Preferred |
| | 140–200 | Most preferred |
| 384* | 7–40 | — |
| | 10–25 | Preferred |
| | 12–18 | Most preferred |

*Measured on HBT Cone and Plate Model Brookfield Viscometer.

The amount of vehicle utilized is determined by the final desired formulation viscosity.

FORMULATION AND APPLICATION

In the preparation of the composition of the present invention, the particulate inorganic solids are mixed with the organic carrier and dispersed with suitable equipment to form a suspension, resulting in a composition for which the viscosity will be in the range of about 100–250 Pa.S at a shear rate of 4 sec$^{-1}$.

In the examples which follow, the formulation was carried out in the following manner: The ingredients of the paste, minus about 5% organic components equivalent to about 0.5% wt. of the formulation, are weighed together in a container. The components are then vigorously mixed to form a uniform blend: then the blend is passed through dispersing equipment to achieve good dispersion of particles. A Hegman gauge is used to determine the state of dispersion of the particles in the paste. This instrument consists of a channel in a block of steel that is 25 $\mu$m deep on one end and ramps up to 0 depth at the other end. A blade is used to draw down paste along the length of the channel. Scratches will appear in the channel where the diameter of the agglomerates is greater than the channel depth. A satisfactory dispersion will give a fourth scratch point of 10–15 $\mu$m typically. The point at which half of the channel is uncovered with a well dispersed paste is between 3 and 8 $\mu$m typically. Fourth scratch measurement of >20 $\mu$m and "half-channel" measurements of >10 $\mu$m indicate a poorly dispersed suspension.

The remaining 5% consisting of organic components of the paste is then added and the content of organic medium is adjusted to bring the viscosity when fully formulated to between 140 and 200 Pa.S at a shear rate of 4 sec$^{-1}$.

The composition is then applied to a substrate usually by the process of screen printing to a wet thickness of about 25–80 microns, preferably 25–60 microns and most preferably 25–35 microns. Though the composition was developed primarily for overprinting on copper-containing substrates, it has also been found to have excellent adhesion and bondability characteristics on alumina. silica-alumina and various dielectric materials such as Du Pont 4575 dielectric. The conductor compositions of this invention can be printed onto the substrate either by using an automatic printer or a hand printer in the conventional manner. Preferably automatic screen stencil techniques are employed using 200- to 325-mesh screens. The printed pattern is then dried at below 200° C., e.g., 120°–150° C., for about 5–15 minutes before firing. Firing to effect sintering of both the inorganic binder and the finely divided copper particles is preferably done in a belt conveyor furnace under a nitrogen atmospheres with a temperature profile that will allow burnout of the organic matter at about 300° C. and densification of the thick film on heating to 800°–1050° C. (preferably 900° C.). This is followed by a controlled cooldown cycle to prevent substrate fracture which can occur from too rapid cooldown. The overall firing procedure will preferably extend over a period of about 1 hour, with 20–25 minutes to reach the peak firing temperature, about 10 minutes at the firing temperature and about 20–25 minutes in cooldown. In some instances, total cycle times as short as 30 minutes can be used. During firing of dried copper films, the oxygen concentration in the hot sections of the furnace should be maintained below 15–20 ppm and preferably below 10 ppm to minimize oxidation of the copper.

TEST PROCEDURES

Adhesion: The adhesion was measured using an "Instron" pull tester in a 90° peel configuration at a pull rate of 2 inches per minute. Twenty gauge pre tinned wires were attached to 80 mil ×80 mil pads by solder Jipping for 10 seconds in 62 Sn/36 Pb/2 Ag solder at 220° C. or in 60 Sn/40 Pb solder at 230° C. using Alpha 611 flux. (Alpha is a tradename for solder flux made by Alpha Metals Inc., Jersey City, N.J.) Aging studies were carried out in air in a Blue M Stabil Therm ® oven controlled at 150° C. for 100 hours. After aging, test parts were allowed to equilibrate several hours in air before the wires were pulled, Particle Size: The size of particles used in the invention was measured with a Sedigraph ® 5000D Particle Size Analyzer. This instrument determines the concentration of particles remaining at decreasing sedimentation depths as a function of time. The logarithm of the difference in transmitted x-ray intensity is electronically generated and converted to present these data as a cumulative mass percent distribution in terms of Stokesian or equivalent spherical diameter in microns ($\mu$m).

SOLDERABILITY

Solderability was determined by a solder spread test which measures the spreading of a standard solder perform under carefully controlled soldering conditions.

Substrate:
  96% alumina (Coors)
  1"×1"×0.020" thick dimensions
Base Copper:
  Du Pont 9922 Thick Film Copper Conductor
  ¾"×¾" square test pattern
Overprint Copper:
  Printed through 325 mesh screen
  ¾"×¾" square test pattern
  96% alumina substrate (above)
  Dried 10 minutes at 120° C.
  Fired in nitrogen in 900° C./60' cycle
Solder Preform:
  60 Sn/40 Pb Composition
  0.062" Diameter ×0.020" thick
Solder Flux:
  Alpha*611, resin mildly activated (RMA) flux
  2 drops (ca. 0.04 grams)
Soldering Conditions:
  15 seconds at 230° C.

*Alpha is tradename of Alpha Metals Corporation, Jersey City, N.J. for solder flux.

PROCEDURE

The overprint copper is printed and fired over a copper thick film made from any suitable conductor composition such as Du Pont 9922 copper. For comparison purposes, solderability data was also obtained for the overprint copper fired directly onto alumina and also over Du Pont 4575 dielectric composition. The solderability of the base coat of Du Pont 9922 copper was used as a control to show the improvement in solderability obtained with the overprint copper composition.

A standard solder preform (as specified above) is placed on the copper thick film substrate. Two drops of Alpha 611 solder flux is placed on the substrate, covering the solder preform. Then the substrate is floated on a solder pot maintained at 230° C.±1° C. The substrate is held at 230° C. for 15±1 second from the time the solder preform first melts and wets the copper. After allowing 15 seconds for the solder to spread. The substrate is removed from the solder pot and allowed to cool without disturbing the molten solder. The time at 230° C. must be carefully controlled in order to obtain reproducible results.

After cleaning off the flux residue in a suitable solvent (e.g., trichloroethane), the surface area, $A_2$, wet by the preform after soldering is measured under a microscope. $A_2$ is then divided by $A_1$, the initial area covered by the solder preform. The ratio $A_2/A_1$ is the solder spread factor which is used to compare the solderability of different copper compositions.

EXAMPLES

In the examples which follow, all proportions are given in weight percentages (% wt.) unless otherwise indicated. In addition, the composition and properties of certain components of the exemplified thick film conductive materials were as follows:

TABLE 1
CHARACTERISTICS OF COPPER POWDERS

|  | Fine Cu Powder | | Coarse Cu Powder | |
| --- | --- | --- | --- | --- |
| Designation | A | B | C | D |
| Properties | | | | |
| % wt. below 0.5 micrometers | 8.0 | 6.0 | ca. 0 | 2.0 |
| Avg. Particle Size, micrometers | 1.0 | 0.70 | 3.1 | 1.6 |
| Surface Area, m²/g | 1.0 | 2.1 | 0.5 | 1.8 |
| Oxygen Content, % Wt. | 0.8 | 0.5 | 0.3 | 0.4 |

TABLE 2
ORGANIC MEDIUM COMPOSITION

| Ethyl Cellulose | 6.0 % Wt. |
| --- | --- |
| α,β-Terpineol | 8.0 |
| Dibutyl Carbitol[1] | 20.0 |
| Dibutyl Phthalate | 53.0 |
| Tridecyl Phosphate | 1.0 |
| Ionol[2] | 1.0 |
| Texanol[3] Ester Alcohol | 11.0 |
| | 100.0 |

[1] Tradename of Union Carbide Co., New York, NY for diethylene glycol dibutyl ether.
[2] Tradename of Shell Chemical Co., Houston, TX for 2,6-di-tertbutyl-4-methyl phenol.
[3] Tradename of Eastman Kodak Company, Rochester, NY for 2,2,4-trimethylpentanediol-1,3 monoisobutyrate.

TABLE 3
COMPOSITION AND PROPERTIES OF OVERPRINT COPPER COMPOSITIONS

| Composition | Example No. | | | | | | | | | | | Control |
| --- | --- | --- | --- | --- | --- | --- | --- | --- | --- | --- | --- | --- |
| | 1 | 2 | 3 | 4 | 5 | 6 | 7 | 8 | 9 | 10 | 11 | |
| Fine Cu | | | | | | | | | | | | |
| Type | A | A/B | A | A | B | B | A | B | B | B | B | Du Pont 9922 copper |
| % wt. | 15 | 75/15 | 15 | 15 | 15 | 15 | 90 | 15 | 15 | 90 | 15 | |
| Coarse Cu | | | | | | | | | | | | |
| Type | C | — | C | C | C | D | — | C | D | — | C | |

TABLE 3-continued
COMPOSITION AND PROPERTIES OF OVERPRINT COPPER COMPOSITIONS

| Composition | 1 | 2 | 3 | 4 | 5 | 6 | 7 | 8 | 9 | 10 | 11 | Control |
|---|---|---|---|---|---|---|---|---|---|---|---|---|
| % wt. | 74 | — | 75 | 75 | 75 | 75 | — | 75 | 75 | — | 75 | |
| Tungsten % wt. | 0.5 | 0.5 | 0.3 | 0.3 | 0.3 | — | 1.0 | 0.5 | — | 0.5 | 0.5 | |
| Oxide Composition | PbO | $Bi_2O_3$ | PbO | CdO | PbO/$Bi_2O_3$/CdO | $PbO_2$ | $PbO_2$ | $PbO_2$ | $PbO_2$ | $PbO_2$ | PbO | |
| % wt. | 0.5 | 0.3 | 0.6 | 1.0 | 0.5/0.3/0.3 | 0.5 | 1.0 | 0.5 | 0.5 | 1.0 | 0.5 | |
| Catalyst Composition | Pd | — | Pd | $RuO_2$ | Pd | Pd | — | — | — | — | — | |
| % wt. | 1.5 | — | 0.5 | 0.5 | 2.0 | 0.5 | — | — | — | — | — | |
| Organic Medium % wt. | 8.5 | 9.2 | 8.6 | 8.2 | 6.6 | 9.0 | 8.0 | 9.0 | 9.5 | 8.5 | 9.0 | |
| Properties | | | | | | | | | | | | |
| Resistivity, mΩ/□/25μ | 1.7 | 1.5 | 1.5 | 1.3 | 1.8 | 1.1 | 1.1 | 1.1 | 1.5 | 1.2 | 1.2 | 1.2 |
| Adhesion on Alumina | | | | | | | | | | | | |
| Initial, Newtons | 15 | 20 | 15 | 9 | 17 | 27 | 23 | 20 | 23 | 22 | 18 | 34 |
| Aged, Newtons | 10 | — | 13 | 10 | 19 | 30 | 26 | 16 | 19 | 16 | — | 22 |
| Solderability, $A_2/A_1$ Over 9922 Copper | 10.0 | 1.6 | 17.0 | 5.5 | 7.6 | 5.0 | 2.4 | 7.9 | 5.0 | 4.1 | 7.0 | 1.4 |

Further to the foregoing table, all of the compositions of Examples 1 through 11 had both initial and aged adhesion values over 9922 copper above 20 Newtons. Furthermore, all of the compositions, except for Examples 2 and 7, showed substantially better solder spreading ($A_2/A_1$) than the 9922 control. The composition of Examples 2 and 7 did not have good solder spreading properties for two reasons: (1) only fine copper powder with high surface areas and high oxygen content was used; and (2) neither composition contained any catalyst to improve the burnout of organics and thus increase sintering and densification of the copper film.

Examples 4 and 5 show the use of oxide bonding agents other than PbO and of catalysts other than Pd.

Example 6 shows that the use of higher surface area copper powders (B and D) results in moderate solder spreading.

Examples 6 and 8-11 each contained either no tungston or no catalyst. The properties of each of these compositions was satisfactory. However, when compared to the examples containing both, their properties were not as good. It is therefore preferred, though not essential, to include both refractory metal (W, Mo, Re) and catalyst (Pd, Pt, Ru, Ir, Rh) in the overprint copper conductor composition in order to obtain optimum performance.

I claim:

1. A composition suitable for use in fritless conductor overprint applications which is an admixture of finely divided particles consisting essentially of
   (a) 10-50% wt. copper metal, all particles of which are less than 2 μm in largest dimension, less than 10% are less than 0.5 μm in largest dimension, have an average particle size of 0.7-1.2 μm and average surface area of less than 2 $m^2$/g;
   (b) 90-50% wt. finely divided copper metal particles, substantially all of which are 1-10 μm in largest dimension and have an average particle size of at least 1.5 μm;
   (c) 0.2-2% wt. of less than 10 μm particles of a reducible heavy metal oxide selected from the group consisting of oxides of lead, bismuth, cadmium, cobalt, nickel and mixtures and precursors thereof;
   (d) 0-1.0% wt. of less than 5 μm particles of a refractory metal selected from the group consisting of tungsten, molyhadenum, thenium and mixtures and alloys thereof: and
   (e) 0-5.0% wt. of a noble metal selected from the group consisting of palladium, platinum, ruthenium, irridium, rhodium and mixtures thereof having a surface area of 2-10 $m^2$/g.

2. The composition of claim 1 which contains at least 0.2% wt. of refractory metal.

3. The composition of claim 1 which contains at least 0.2% wt. of noble metal.

4. A printable thick film composition comprising the composition of claim 1 dispersed in organic medium.

5. The composition of claim 1 in which the average particle size of the copper component (a) is about 1 micron.

6. The composition of claim 1 which contains 0.5-1.0% wt. reducible heavy metal oxide.

7. The composition of claim 1 which contains 0.3-0.7% wt. tungsten metal.

8. The composition of claim 1 which contains 0.3-0.7% wt. refractory metal.

* * * * *